(12) United States Patent
Juan et al.

(10) Patent No.: US 10,727,141 B2
(45) Date of Patent: Jul. 28, 2020

(54) METHOD FOR INSPECTING SENSOR PACKAGE STRUCTURE, INSPECTION APPARATUS, AND FOCUS ASSISTANT LOADER OF INSPECTION APPARATUS

(71) Applicant: KINGPAK TECHNOLOGY INC., Hsin-Chu County (TW)

(72) Inventors: Yi-Cheng Juan, Hsin-Chu County (TW); Han-Hsing Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 294 days.

(21) Appl. No.: 15/942,138

(22) Filed: Mar. 30, 2018

(65) Prior Publication Data

US 2019/0164853 A1    May 30, 2019

(30) Foreign Application Priority Data

Nov. 29, 2017  (TW) .............................. 106141612 A

(51) Int. Cl.
| | |
|---|---|
| *G06K 9/20* | (2006.01) |
| *H01L 21/66* | (2006.01) |
| *H01L 21/68* | (2006.01) |
| *B07C 5/342* | (2006.01) |
| *H01L 21/683* | (2006.01) |
| *H01L 27/146* | (2006.01) |

(52) U.S. Cl.
CPC .............. *H01L 22/20* (2013.01); *B07C 5/342* (2013.01); *B07C 5/3422* (2013.01); *H01L 21/68* (2013.01); *H01L 22/12* (2013.01); *H01L 21/6838* (2013.01); *H01L 22/30* (2013.01); *H01L 27/14618* (2013.01)

(58) Field of Classification Search
CPC ..... H01L 22/20; H01L 21/68; H01L 21/6838; H01L 22/12; H01L 22/30; H01L 27/14618; B07C 5/342; B07C 5/3422
See application file for complete search history.

(56) References Cited

U.S. PATENT DOCUMENTS

| | | | |
|---|---|---|---|
| 2004/0140820 A1* | 7/2004 | Sakagawa | G01R 31/2851 324/754.07 |
| 2007/0194229 A1* | 8/2007 | Okuda | H01J 37/026 250/310 |
| 2009/0016595 A1* | 1/2009 | Peterson | G03F 1/84 382/144 |

(Continued)

*Primary Examiner* — Sean T Motsinger
(74) *Attorney, Agent, or Firm* — Li & Cai Intellectual Property (USA) Office

(57) ABSTRACT

An inspection apparatus includes a focus assistant loader and a camera assembly. The focus assistant loader includes a fetching member and a focus member connected to the fetching member. The focus member includes a plurality of focus portions respectively located at different levels. The camera assembly includes a plurality of cameras. The cameras may face the focus assistant loader and respectively focus on the focus portions. Thus, by using the cameras to focus on the focus portions, the inspection apparatus may find out tiny defects on a tested device held by the focus assistant loader. In addition, the present disclosure also discloses a focus assistant loader of an inspection apparatus and a method for inspecting a sensor package structure.

10 Claims, 4 Drawing Sheets

(56) References Cited

U.S. PATENT DOCUMENTS

| | | | |
|---|---|---|---|
| 2010/0188486 A1* | 7/2010 | Amanullah | G01N 21/8806 348/48 |
| 2011/0133066 A1* | 6/2011 | Nozoe | H01J 37/265 250/252.1 |
| 2015/0103156 A1* | 4/2015 | Northrup | G02B 21/365 348/79 |
| 2016/0377412 A1* | 12/2016 | Li | G01B 11/0641 356/630 |
| 2017/0256070 A1* | 9/2017 | Son | G06T 7/62 |
| 2019/0033232 A1* | 1/2019 | Ahn | G01N 21/8806 |
| 2019/0164853 A1* | 5/2019 | Juan | B07C 5/3422 |

* cited by examiner

METHOD FOR INSPECTING SENSOR PACKAGE STRUCTURE, INSPECTION APPARATUS, AND FOCUS ASSISTANT LOADER OF INSPECTION APPARATUS

BACKGROUND OF THE INVENTION

1. Field of the Invention

The present disclosure relates to an inspecting method and an inspection apparatus; in particular, to a method for inspecting a sensor package structure, an inspection apparatus, and a focus assistant loader of an inspection apparatus.

2. Description of Related Art

In a conventional inspection apparatus for inspecting package structures, top surfaces of package structures are sucked by suction nozzles, then moved and placed onto a tray sequentially. When optical inspections are being made on the package structures disposed on the tray, a camera of the conventional inspection apparatus takes a picture of the top surface of each package structure, and the captured image information is then compared with a reference image for determining if the package structure is defective.

However, the tray may have been warped due to the weight of itself and the package structures it is bearing, so that when the camera is used to capture an image of the package structure disposed on the tray, focusing on the package structure with the camera having a fixed focal length may inherit an error, which makes the conventional inspection apparatus more difficult to find out tiny defects of the package structure.

SUMMARY OF THE INVENTION

The present disclosure provides a method for inspecting a sensor package structure, an inspection apparatus, and a focus assistant loader of an inspection apparatus to solve the drawbacks associated with conventional inspection apparatuses.

The present disclosure discloses a method for inspecting a sensor package structure, which includes a fetching process and an inspecting process. The fetching process is implemented by using a focus assistant loader to fetch a sensor package structure having a sensor chip. A plurality of focus portions of the focus assistant loader and an image sensing region of the sensor chip face the same direction. The sensor package structure includes a plurality of test regions respectively located at different heights, the focus portions are arranged outside the sensor package structure, and positions of the focus portions respectively correspond to the heights of the test regions. The inspecting process is implemented by using a plurality of cameras to respectively focus on the focus portions, and then using the cameras to respectively capture images of the test regions for obtaining image information of each of the test regions.

The present disclosure also discloses an inspection apparatus, which includes a focus assistant loader and a camera assembly. The focus assistant loader includes a fetching member and a focus member connected to the fetching member. The focus member includes a plurality of focus portions respectively located at different levels. The camera assembly includes a plurality of cameras capable of facing the focus assistant loader to respectively focus on the focus portions.

The present disclosure further discloses a focus assistant loader of an inspection apparatus. The focus assistant loader includes a fetching member and a focus member connected to the fetching member. The focus member includes a plurality of focus portions respectively located at different levels.

In summary, the inspecting method, inspection apparatus and focus assistant loader disclosed in embodiments of the present disclosure are provided with the focus portions respectively disposed at different levels in the focus assistant loader, the cameras thus may focus on the focus portions and further take pictures of the test regions at different heights corresponding to levels of the focus portions. Therefore, any tiny defect (e.g., a particle or a scratch smaller than 50 μm) of each test region can be clearly photographed.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 4, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

The present embodiment discloses an inspection apparatus 1 and a method for inspecting a sensor package structure. The inspection apparatus 1 can be used for inspecting a sensor package structure 2, and can be used for implementing the method thereof. However, the inspection apparatus 1 of the present disclosure is not limited to inspecting a sensor package structure, and the method of the present disclosure is not limited to be implemented by using the inspection apparatus 1. In order to clearly describe the present embodiment, the following description first discloses the inspection apparatus 1, and then discloses the method for inspecting a sensor package structure.

Figure 1:
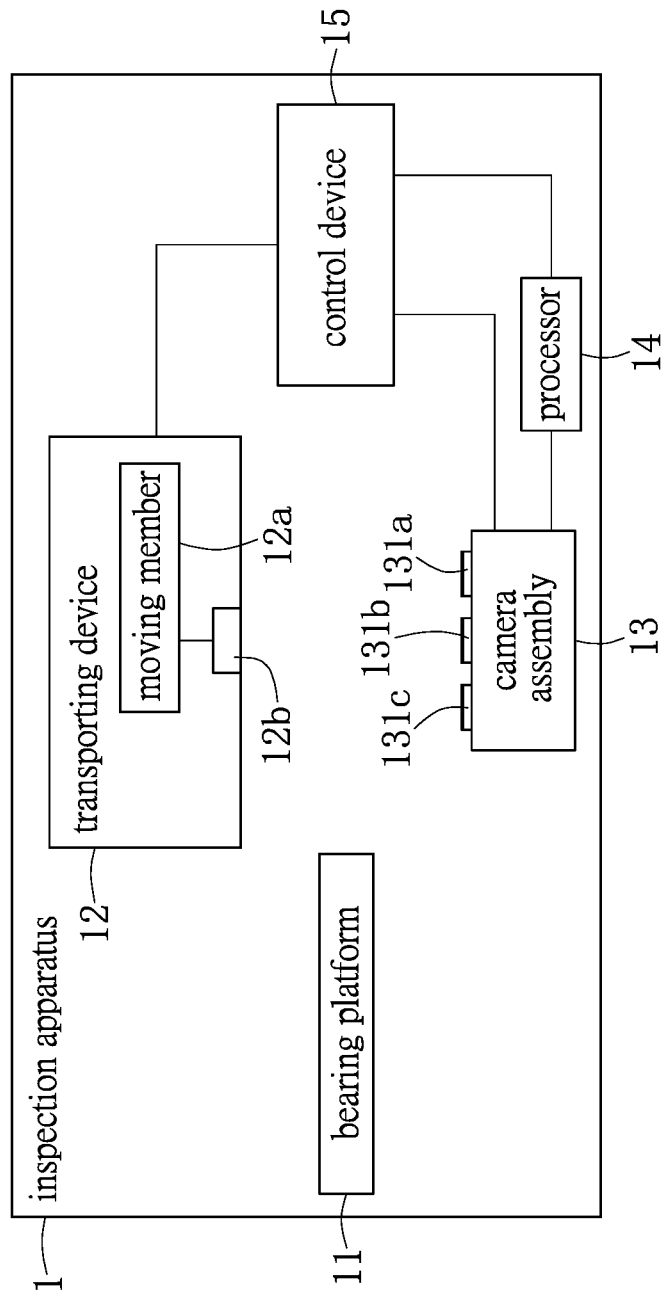
FIG. 1 is a functional block view showing an inspection apparatus according to the present disclosure.
Figure 2:
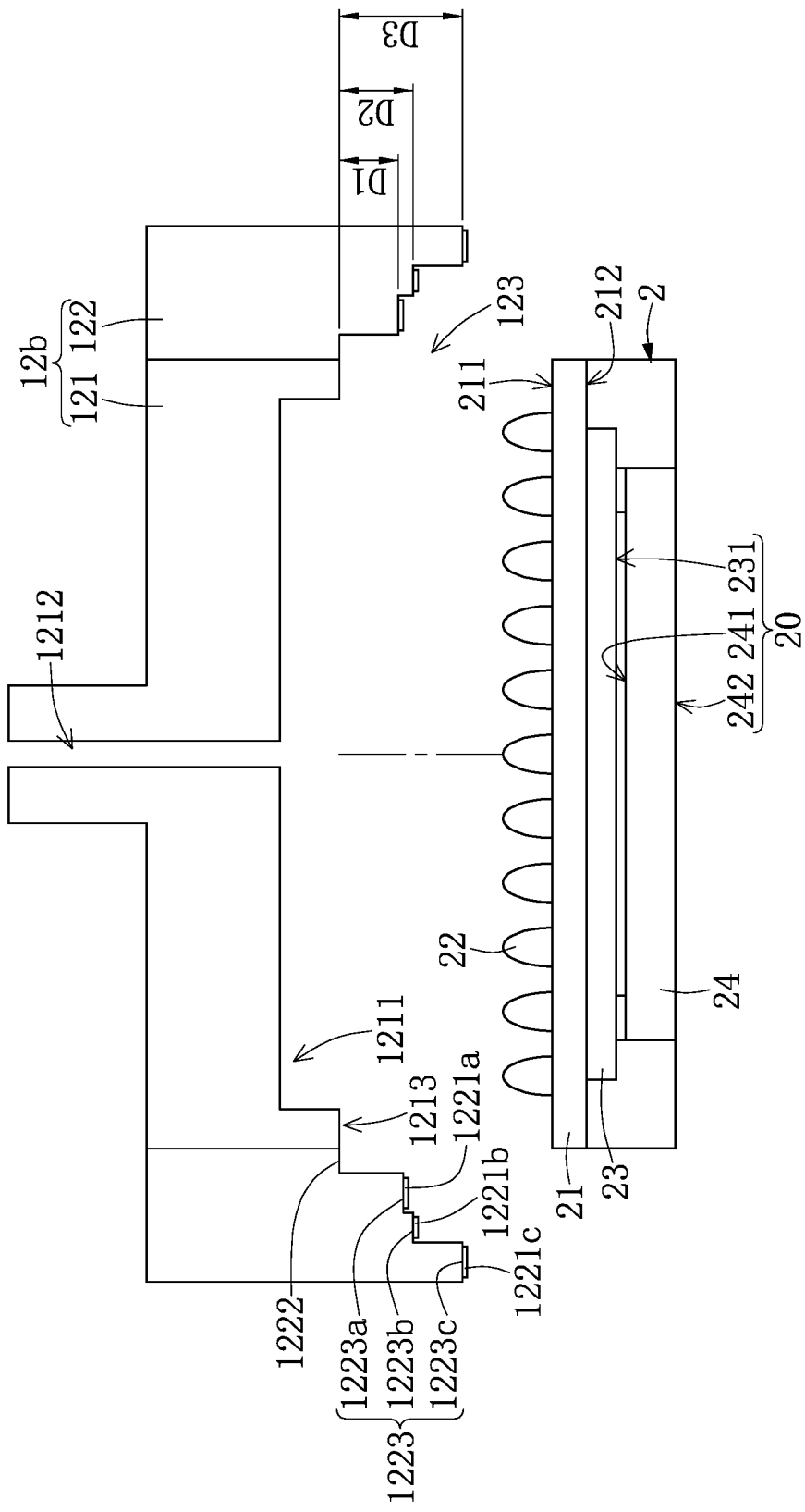
FIG. 2 is an exploded view showing a focus assistant loader and a sensor package structure according to the present disclosure.
Figure 3:
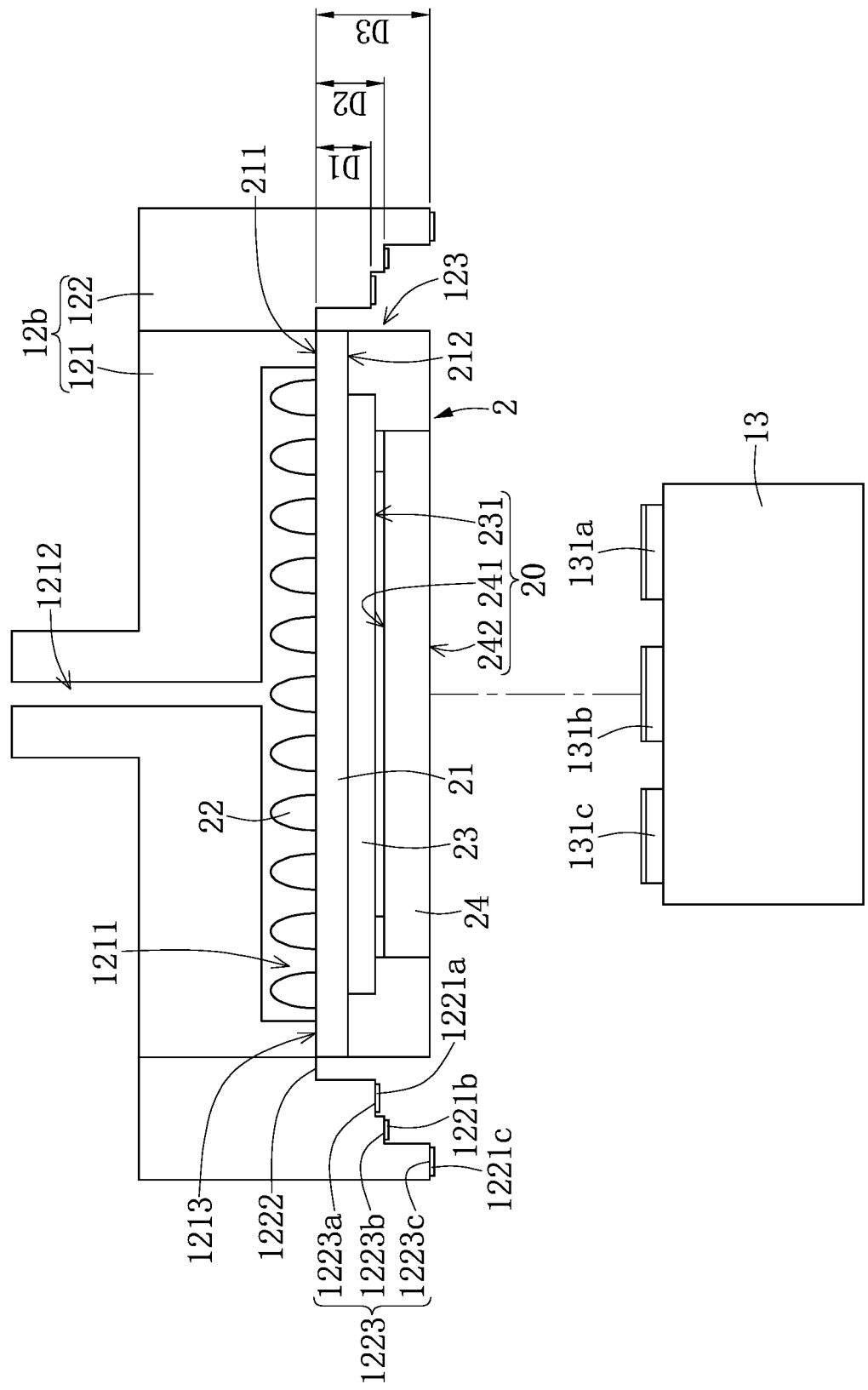
FIG. 3 is a schematic view showing the sensor package structure being attached by suction to the focus assistant loader and a camera assembly corresponding to the focus assistant loader according to the present disclosure.
Figure 4:
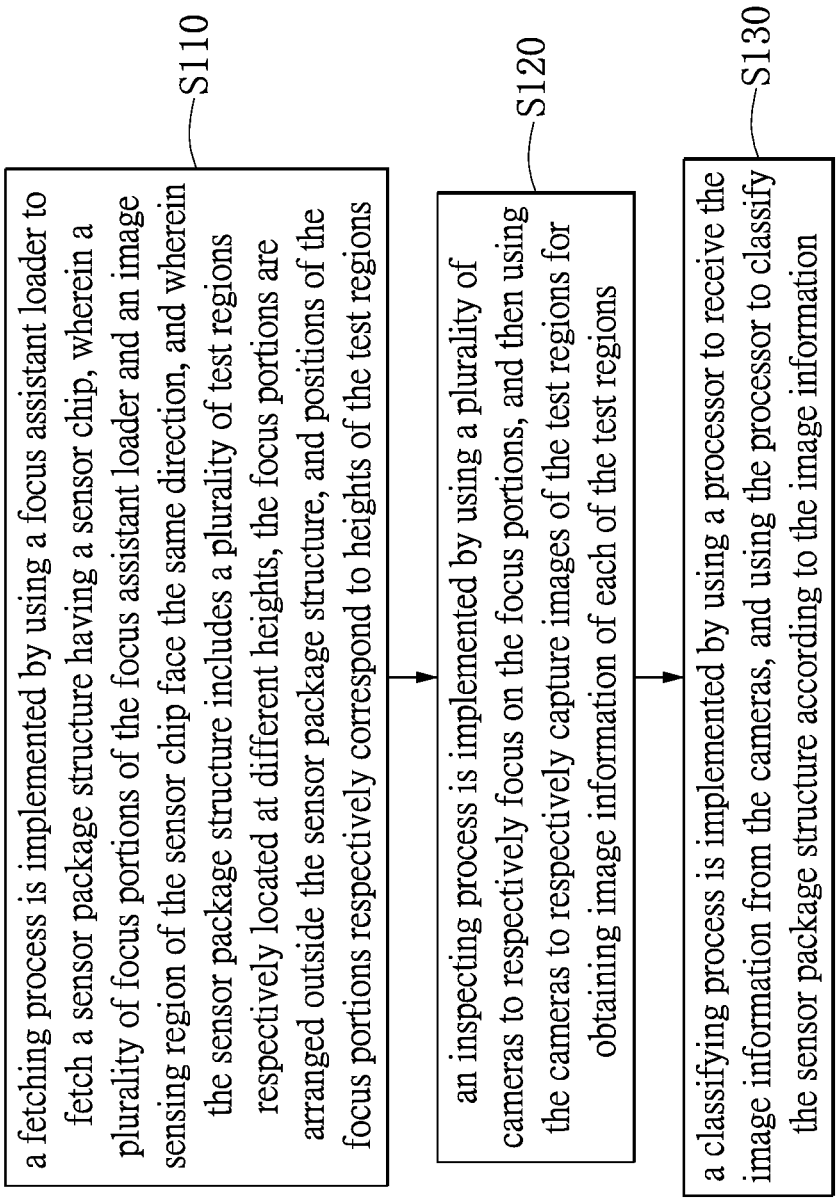
FIG. 4 is a flowchart view of a method for inspecting the sensor package structure according the present disclosure.

As shown in FIGS. 1 to 3, the inspection apparatus 1 includes a bearing platform 11, a transporting device 12, a camera assembly 13, a processor 14, and a control device 15. The bearing platform 11 is configured to allow a plurality of sensor package structures 2 to be disposed thereon. The transporting device 12 is configured to fetch at least one of the sensor package structures 2 from the bearing platform 11 to a predetermined position that corresponds in position to the camera assembly 13, for inspecting the at least one sensor package structure 2 by using the camera assembly 13. The processor 14 is electrically connected to the camera assembly 13, and the processor 14 is configured to receive and compare image information obtained from the camera assembly 13. The control device 15 is electrically connected to the transporting device 12, the camera assembly 13, and the processor 14 for driving the transporting device 12, the camera assembly 13, and the processor 14.

It should be noted that the present embodiment discloses only a part of the inspection apparatus 1, and the specific structure of the inspection apparatus 1 may be modified according to different design requirements and is not limited to the disclosure.

The sensor package structure 2 in the present embodiment includes a substrate 21, a plurality of solder balls 22 mounted on a bottom surface 211 of the substrate 21, a sensor chip 23 mounted on a top surface 212 of the substrate 21, and a transparent plate 24 corresponding in position to the sensor chip 23. The sensor package structure 2 includes a plurality of test regions 20 respectively located at different heights, and the test regions 20 in the present embodiment include an image sensing region 231 of the sensor chip 23 and two opposite surfaces (i.e., an inner surface 241 and an outer surface 242 opposite to the inner surface 241) of the transparent plate 24, but the present disclosure is not limited thereto.

The transporting device 12 includes a moving member 12a and at least one focus assistant loader 12b installed on the moving member 12a. The moving member 12a is configured to move the focus assistant loader 12b between the bearing platform 11 and the camera assembly 13. The moving member 12b in the present embodiment can be a slide rail or a mechanical arm, but the present disclosure is not limited thereto.

Moreover, the focus assistant loader 12b in the present embodiment can be used to fetch the sensor package structure 2. The focus assistant loader 12b includes a fetching member 121 and a focus member 122 connected to the fetching member 121. The focus member 122 includes a plurality of focus portions 1221a, 1221b, 1221c respectively located at different levels, and the number of the focus portions 1221a, 1221b, 1221c is preferably equal to the number of the test regions 20 of the sensor package structure 2. The focus portions 1221a, 1221b, 1221c in the present embodiment can be reference marks, reference patterns, or other distinctive structures, but the present disclosure is not limited thereto.

It should be noted that the focus assistant loader 12b of the present disclosure is not limited to being applied to or cooperated with the corresponding components of the present embodiment. That is to say, the focus assistant loader 12b of the present disclosure can be applied to other inspection apparatuses or other objects under test.

Moreover, the focus assistant loader 12b in the present embodiment is illustrated based on having a structure capable of sucking the sensor package structure 2, but the structure of the focus assistant loader 12b is not limited thereto. For example, in other embodiments of the present disclosure, the focus assistant loader 12b can be a structure capable of clamping the sensor package structure 2 and being rotatable within a range of at least 180 degrees to make the focus portions 1221a, 1221b, 1221c face different directions (such as, to face the camera assembly 13).

Specifically, the fetching member 121 in the present embodiment is a vacuum nozzle, and the focus member 122 is fastened to an outer side surface of the fetching member 121. The inner sides of the fetching member 121 and the focus member 122 jointly define an accommodating slot 123, and the focus portions 1221a, 1221b, 1221c respectively correspond to different levels of the accommodating slot 123. The fetching member 121 has a solder ball receiving space 1211 in the accommodating slot 123. The solder ball receiving space 1211 communicates with an airflow channel 1212 of the fetching member 121, and a depth of the solder ball receiving space 1211 is preferably larger than a height of each of the solder balls 22 of the sensor package structure 2.

Moreover, the focus member 122 has stepped inner sides and includes a bottom step 1222 and a plurality of steps 1223, and the focus portions 1221a, 1221b, 1221c are respectively arranged on the steps 1223. In the present embodiment, the bottom step 1222 is substantially flush with an end surface 1213 of the fetching member 121, and outwardly from the bottom step 1222, the steps 1223 are sequentially defined as a first step 1223a, a second step 1223b, and a third step 1223c. The focus portions 1221a, 1221b, 1221c are respectively arranged on the first step 1223a, the second step 1223b, and the third step 1223c.

Specifically, a vertical distance D1 from the first step 1223a (or the corresponding focus portion 1221a) to the bottom step 1222 is substantially equal to a vertical distance from the image sensing region 231 of the sensor package structure 2 to the bottom surface 211 of the substrate 21. A vertical distance D2 from the second step 1223b (or the corresponding focus portion 1221b) to the bottom step 1222 is substantially equal to a vertical distance from the inner surface 241 of the transparent plate 24 of the sensor package structure 2 to the bottom surface 211 of the substrate 21. A vertical distance D3 from the third step 1223c (or the corresponding focus portion 1221c) to the bottom step 1222 is substantially equal to a vertical distance from the outer surface 242 of the transparent plate 24 of the sensor package structure 2 to the bottom surface 211 of the substrate 21.

In other words, when the fetching member 121 of the focus assistant loader 12b holds the sensor package structure 2 in the accommodating slot 123 by suction, the solder balls 22 of the sensor package structure 2 locate in the solder ball receiving space 1211 of the fetching member 121, and the end surface 1213 of the fetching member 121 (and/or the bottom step 1222 of the focus member 122) abuts the bottom surface 211 of the substrate 21 of the sensor package structure 2. Therefore, vertical distances from the focus portions 1221a, 1221b, 1221c to a plane coplanar with the bottom surface 211 of the substrate 21 are respectively equal to vertical distances from the test regions 20 to the plane.

In other embodiments of the present embodiments, the focus member 122 can be a retractable structure, which can be in an expanded mode (similar to FIG. 2) or in a collapsed mode (not shown). In more detail, when the focus assistant loader 12 is to suck a sensor package structure 2 on the platform 11, the focus member 122 is in the collapsed mode so that the steps 1223 are roughly flush with the bottom step 1222, thereby preventing the steps 1223 from contacting the platform 11. After the sensor package structure 2 has been sucked by the focus assistant loader 12, the focus member 122 is in the expanded mode for facilitating subsequent focusing of the camera assembly 13.

The transporting device 12 can include a rotating mechanism (not shown), which is provided for rotating the sensor package structure 2 so that the bottom surface 211 of the substrate 21 faces upward. For example, when the bottom surface 211 of the substrate 21 of the sensor package structure 2 does not face upward, in order to enable the focus assistant loader 12b to easily suck the bottom surface 211 of the substrate 21, the sensor package structure 2 is rotated (through using the rotating mechanism) within a range of at least 180 degrees, thereby allowing the focus portions 1221a, 1221b, 1221c to face different directions (such as, to face the camera assembly 13).

The camera assembly 13 includes a plurality of cameras 131a, 131b, 131c, and the number of the cameras 131a, 131b, 131c is preferably equal to the number of the focus portions 1221a, 1221b, 1221c, but the present disclosure is not limited thereto. The cameras 131a, 131b, 131c are capable of facing the focus assistant loader 12b to respectively focus on the focus portions 1221a, 1221b, 1221c, thereby precisely obtaining image information of the test regions 20 with heights corresponding to the focus portions 1221a, 1221b, 1221c. The processor 14 is configured to receive and compare image information obtained from the cameras 131a, 131b, 131c.

The control device 15 is electrically connected to the focus assistant loader 12b and the camera assembly 13. The control device 15 is configured to drive the fetching member 121 of the focus assistant loader 12b to hold the sensor package structure 2 in the accommodating slot 123 by suction, and is configured to drive the cameras 131a, 131b, 131c of the camera assembly 13 to respectively focus on the focus portions 1221a, 1221b, 1221c.

The inspection apparatus 1 of the present embodiment has been disclosed in the above description, and the following description discloses the method for inspecting a sensor package structure according to the present embodiment. The method in the following description is implemented by using the inspection apparatus 1, but the present disclosure is not limited thereto. Moreover, details related to the structure of the inspection apparatus 1 will not be repeated again in the following description.

As shown in FIGS. 1 to 4, the method for inspecting a sensor package structure in the present embodiment preferably includes a fetching process S110, an inspecting process S120, and a classifying process S130, and the specific way or sequence of implementing the processes S110~S130 can be modified according to design requirements. For example, the method can be implemented without the classifying process S130.

The fetching process S110 is implemented by using the focus assistant loader 12b of the transporting device 12 to hold (such as, to suck) a sensor package structure 2, so that the focus portions 1221a, 1221b, 1221c are arranged outside the sensor package structure 2, and further the focus portions 1221a, 1221b, 1221c and the image sensing region 231 of the sensor chip 23 face the same direction. Moreover, the transporting device 12 can move the focus assistant loader 12b and the sensor package structures 2 held by the focus assistant loader 12b to a predetermined position corresponding in position to the camera assembly 13 (e.g., within a photographing range of the camera assembly 13).

Specifically, the focus assistant loader 12b sucks the bottom surface 211 of the sensor package structure 2 and is spaced apart from the solder balls 22. The transporting device 12 is preferably configured to adjust the focus assistant loader 12b so that the focus portions 1221a, 1221b, 1221c and the image sensing region 231 face the ground, thereby preventing dust or particles from polluting the outer surface 242 of the transparent plate 24 of the sensor package structure 2. In the present embodiment, the image sensing region 231 is not limited to face the ground along a vertical line perpendicular to the image sensing region 231, when an angle between a normal line of the image sensing region 231 and the vertical line is equal to or less than 60 degrees, the image sensing region 231 can be regarded as facing the ground.

The inspecting process S120 is implemented by using the cameras 131a, 131b, 131c of the camera assembly 13 to respectively focus on the focus portions 1221a, 1221b, 1221c, and then using the cameras 131a, 131b, 131c to respectively capture images of the test regions 20 (such as, the image sensing region 231 and the inner and outer surfaces 241, 242 of the transparent plate 24) for obtaining image information of each of the test regions 20.

Accordingly, the cameras 131a, 131b, 131c take pictures of the test regions 20 to precisely obtain the image information after respectively focusing on the focus portions 1221a, 1221b, 1221c, so that any tiny defect (e.g., a particle or a scratch smaller than 50 µm) of each of the test regions 20 can be clearly shown by the image information, which effectively increases accuracy of the inspection.

The classifying process S130 is implemented by using the processor 14 to receive the image information from the cameras 131a, 131b, 131c, and using the processor 14 to classify the sensor package structure 2 according to the image information. In other words, the sensor package structure 2 can be binned according to the types or number of defects, thereby increasing efficiency of the inspection and reducing labor cost.

THE EFFECTS OF THE PRESENT DISCLOSURE

In summary, the inspecting method, inspection apparatus and focus assistant loader disclosed in embodiments of the present disclosure are provided with the focus portions respectively disposed at different levels in the focus assistant loader. The cameras thus may focus on the focus portions and further take pictures of the test regions with heights corresponding to the focus portions, after respectively focusing on the focus portions. Therefore, any tiny defect (e.g., a particle or a scratch smaller than 50 µm) of each test region can be clearly photographed.

Moreover, the focus assistant loader and the sensor package structure held by the focus assistant loader can be adjusted to face the ground, thereby preventing dust or particles from contaminating the outer surface of the transparent plate of the sensor package structure, reducing the defect loss of the sensor package structure.

In addition, the processor is provided to receive and compare the image information obtained by the cameras from the test regions, and is configured to classify the sensor package structure according to the image information, thereby increasing inspection efficiency and reducing labor cost.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A method for inspecting a sensor package structure, comprising:
    implementing a fetching process by using a focus assistant loader to fetch a sensor package structure having a sensor chip, wherein a plurality of focus portions of the focus assistant loader and an image sensing region of the sensor chip face the same direction, and wherein the sensor package structure includes a plurality of test regions respectively located at different heights, the focus portions are arranged outside the sensor package structure, and positions of the focus portions respectively correspond to the heights of the test regions; and implementing an inspecting process by using a plurality of cameras to respectively focus on the focus portions, and then using the cameras to respectively capture images of the test regions for obtaining image information of each of the test regions.

2. The method as claimed in claim 1, wherein in the fetching process, the sensor package structure is sucked by the focus assistant loader of a transporting device, and the transporting device adjusts the focus assistant loader so that the focus portions and the image sensing region face the ground.

3. The method as claimed in claim 1, wherein the sensor package structure includes a substrate, a plurality of solder balls mounted on a bottom surface of the substrate, the sensor chip mounted on a top surface of the substrate, and a transparent plate corresponding in position to the sensor chip; the test regions of the sensor package structure include the image sensing region of the sensor chip and two opposite surfaces of the transparent plate; in the fetching process, the focus assistant loader sucks the bottom surface of the substrate and is spaced apart from the solder balls.

4. The method as claimed in claim 3, wherein vertical distances from the focus portions to a plane coplanar with the bottom surface of the substrate are respectively equal to vertical distances from the test regions to the plane.

5. The method as claimed in claim 1, further comprising:
implementing a classifying process by using a processor to receive the image information from the cameras, and using the processor to classify the sensor package structure according to the image information.

6. An inspection apparatus, comprising:
a focus assistant loader including a fetching member and a focus member connected to the fetching member, wherein the focus member includes a plurality of focus portions respectively located at different levels; and a camera assembly including a plurality of cameras, wherein the cameras are capable of facing the focus assistant loader to respectively focus on the focus portions, wherein the focus assistant loader is rotatable within a range of at least 180 degrees to make the focus portions face different directions.

7. The inspection apparatus as claimed in claim 6, further comprising a processor electrically connected to the camera assembly, wherein the processor is configured to receive and compare image information obtained from the cameras.

8. The inspection apparatus as claimed in claim 6, further comprising a control device electrically connected to the focus assistant loader and the camera assembly, wherein the inner sides of the fetching member and the focus member jointly define an accommodating slot, and the focus portions respectively correspond to different heights of the accommodating slot, and wherein the control device is configured to drive the fetching member of the focus assistant loader to hold a sensor package structure in the accommodating slot by suction, and is configured to drive the cameras of the camera assembly to respectively focus on the focus portions.

9. A focus assistant loader of an inspection apparatus, comprising:
a fetching member; and
a focus member connected to the fetching member, wherein the focus member includes a plurality of focus portions respectively located at different levels,
wherein the focus member has stepped inner sides and includes a plurality of steps, and the focus portions are respectively arranged on the steps.

10. The focus assistant loader of the inspection apparatus as claimed in claim 9, wherein the inner sides of the fetching member and the focus member jointly define an accommodating slot, the focus portions are arranged at different heights of the accommodating slot, and the fetching member has a solder ball receiving space in the accommodating slot.

* * * * *